(12) United States Patent
Wakamatsu et al.

(10) Patent No.: US 8,945,303 B2
(45) Date of Patent: Feb. 3, 2015

(54) DEVICE FOR CRYSTALLIZING BIOPOLYMER, CELL OF SOLUTION FOR CRYSTALLIZING BIOPOLYMER, METHOD FOR CONTROLLING ALIGNMENT OF BIOPOLYMER, METHOD FOR CRYSTALLIZING BIOPOLYMER AND BIOPOLYMER CRYSTAL

(75) Inventors: Takashi Wakamatsu, Hitachinaka (JP); Yuki Ohnishi, Ibaraki (JP)

(73) Assignee: Institute of National Colleges of Technology, Japan, Tokyo (JP)

( * ) Notice: Subject to any disclaimer, the term of this patent is extended or adjusted under 35 U.S.C. 154(b) by 824 days.

(21) Appl. No.: 13/254,726

(22) PCT Filed: Feb. 18, 2010

(86) PCT No.: PCT/JP2010/001044
§ 371 (c)(1),
(2), (4) Date: Sep. 2, 2011

(87) PCT Pub. No.: WO2010/100847
PCT Pub. Date: Sep. 10, 2010

(65) Prior Publication Data
US 2011/0308948 A1    Dec. 22, 2011

(30) Foreign Application Priority Data

Mar. 3, 2009    (JP) .................................. 2009-049043

(51) Int. Cl.
*C30B 7/08*    (2006.01)
*C30B 29/58*    (2006.01)
(Continued)

(52) U.S. Cl.
CPC . *C30B 29/58* (2013.01); *C30B 7/00* (2013.01); *C30B 30/02* (2013.01)
USPC ................. 117/68; 117/69; 117/70; 117/925; 117/927

(58) Field of Classification Search
USPC ................. 117/68, 69, 70, 925, 927
See application file for complete search history.

(56) References Cited

U.S. PATENT DOCUMENTS 6,001,176 A * 12/1999 Leiter et al. .................... 117/206
6,077,390 A *  6/2000 Salman et al. ................. 162/117
(Continued)

FOREIGN PATENT DOCUMENTS

EP    1 114 886 A1    7/2001
JP    2000-63199 A    2/2000
(Continued)

OTHER PUBLICATIONS

Al-Haq et al., "An apparatus for electric-field-induced protein crystallization", Journal of Applied Crystallography, vol. 40, 2007, pp. 199-201.
(Continued)

*Primary Examiner* — Bob M Kunemund
(74) *Attorney, Agent, or Firm* — Birch, Stewart, Kolasch & Birch, LLP (57) ABSTRACT

The subject is providing a crystallizing device of a biopolymer, which made to form biopolymer crystal efficiently in crystallization solution of a small amount of biopolymers by applying a low voltage and not to make an electrode disturb but observable a state of crystal formation. As an electrode for applying an electric field to a biopolymer solution, a transparent conductor, which does not disturb crystal formation, is used. Between the transparent conductor electrodes 2*s*, the electric insulating member 4 is placed and the crystallization solution 1 for a small amount of biopolymers is maintained inter-electrode. A biopolymer is efficiently crystallized by applying a low voltage supplied from the voltage generator 5 to the transparent conductor electrode 2. A crystal formation state of a biopolymer is optically observable from the electrode side of a transparent conductor. Orientation control of the biopolymer can be performed by an electric field formed by the above-mentioned voltage application.

15 Claims, 4 Drawing Sheets

(51) Int. Cl.
*C30B 7/00* (2006.01)
*C30B 30/02* (2006.01)

(56) References Cited

U.S. PATENT DOCUMENTS

| | | | |
|---|---|---|---|
| 6,297,021 B1 * | 10/2001 | Nienaber et al. | 435/7.1 |
| 6,811,608 B1 * | 11/2004 | Stewart et al. | 117/68 |
| 7,166,161 B2 * | 1/2007 | Lazarev et al. | 117/4 |
| 7,308,012 B2 * | 12/2007 | Namiwaka et al. | 372/50.1 |

FOREIGN PATENT DOCUMENTS

| | | |
|---|---|---|
| JP | 2003-306497 A | 10/2003 |
| JP | 2007-61672 A | 3/2007 |
| WO | WO 01/86037 A1 | 11/2001 |
| WO | WO 2007/063898 A1 | 6/2007 |

OTHER PUBLICATIONS

Taleb et al., "Equilibrium kinetics of lysozyme crystallization under an external electric field", Journal of Crystal Growth, vol. 232, 2001, pp. 250-255.

* cited by examiner

DEVICE FOR CRYSTALLIZING BIOPOLYMER, CELL OF SOLUTION FOR CRYSTALLIZING BIOPOLYMER, METHOD FOR CONTROLLING ALIGNMENT OF BIOPOLYMER, METHOD FOR CRYSTALLIZING BIOPOLYMER AND BIOPOLYMER CRYSTAL

FIELD OF THE INVENTION

The present invention is related to a crystallizing device of a biopolymer, a crystallization solution cell of a biopolymer, an orientation control method of a biopolymer, a crystallization method of a biopolymer, and a crystal of a biopolymer.

Especially, the present invention is related to a crystallizing device of a biopolymer, a crystallization solution cell of a biopolymer, an orientation control method of a biopolymer, a crystallization method of a biopolymer, and a crystal of a biopolymer, which can be obtained qualifying crystals used for crystallography.

BACKGROUND OF THE INVENTION

Heretofore, technology of crystallography is indispensable in order to elucidate a function of a biopolymer represented by protein. The crystal structure of a biopolymer is analyzed by using nuclear magnetic resonance (NMR) measurement, X diffraction measurement, neutron diffraction measurement, etc. By using data of analyzed crystal structure, further analysis for higher-order structure and function of the biopolymer can be carried out.

For such crystallography and evaluation of a biopolymer, it is required to produce a good crystal.

In recent years, the number of a biopolymer having known a crystallization condition is increased rapidly. However, a systematic theory about formation of a crystalline nucleus and crystal growth is not found.

Here, as a factor for crystallizing a biopolymer, various kinds factor are considered: for example, solution concentration of a biopolymer, a type of a precipitant and its concentration, a type of buffer solution and its pH value, temperature of solution, etc. Formerly, for each biopolymer, it is experimented by trial and error about the factor of such crystallization, respectively. Thus, search of crystallization conditions was inefficient.

In addition, the crystal growth rate of the biopolymer in solution was very slow, formerly. Therefore, even under most suitable crystallization condition, for being able to confirm formation of a crystal with an optical microscope etc., time from at least several days to several weeks, or for several months or more, depending on a case, was required.

In this way, production of the biopolymer crystal had required great time and effort.

In addition, in order to have made the good biopolymer crystal suitable for crystallography, high-purity biopolymer materials were used.

Therefore, by a cost problem, it was preferred that the amount of solution used by crystal production is very small quantities, for example, less than several tens of micro L.

However, when a crystal is prepared by comprehensive searching for crystallization conditions inefficiently, volume more than that was needed.

Therefore, a promoting method of crystallization of a biopolymer, which does not depend on search of inefficient and comprehensive crystallization conditions on the above, is desired.

Formerly, a photoirradiation method, the strong magnetic field applying method, the electric field applying method, etc., are proposed as a promoting method of such crystallization.

Especially in these, crystallization by photoirradiation or electric field application was easy practicing method, comparatively.

Firstly, as refer to the patent documents 1, it is disclosed about the manufacturing method of biopolymer crystals, such as protein by the conventional photoirradiation, especially ultraviolet rays, and its manufacturing device. In the crystallization method by the conventional photoirradiation, which was described in the patent documents 1, in many cases, the ultraviolet rays having wavelength about 200-350 nm in which the optical absorption of a biopolymer occurs were used.

However, irradiation of energy-rich ultraviolet rays changed molecular structure of a biopolymer itself and had the problem to damage to the biopolymer directly. Thus, a crystallization method by photoirradiation was not preferred in order to obtain a good crystal of a biopolymer.

In a crystallization method by the conventional electric field application on the other hand as roughly classified, two kinds of methods, the internal electric field applying method and the external electric field applying method, mainly existed.

The internal electric field applying method is a crystallization method which contacts electrodes of voltage application in crystallization solution directly, and applies an electric field. The external electric field applying method is a crystallization method which puts an insulator near electrodes and applies an electric field to crystallization solution indirectly.

A crystallization method by electric field application, such as these internal electric field applying method and the external electric field applying method, unlike ultraviolet irradiation, little damage to a biopolymer is observed if a low electric field is applied.

Here, the internal electric field applying method is the voltage application method to contact electrodes in crystallization solution directly, as mentioned above.

Formerly, in the internal electric field applying method, conductive metals, such as copper, silver, gold, and platinum, were used as an electrode for applying an electric field to crystallization solution.

However, these metallic materials had a problem that a surface of metal generally served as a crystalline nucleus of a biopolymer in many cases.

Hence, there was a case where a lot of crystallites were formed near a metal electrode at once regardless of existence of electric field application to crystallization solution. By this reason, it might become the disturbance of good crystal formation.

Therefore, the conventional internal electric field applying method had a problem that control of crystal growth was difficult.

Thus, as a crystallization method by electric field application, the external electric field applying method is frequently used from the former.

In such conventional external electric field applying methods, it is devised in order that the electrode itself may not become the impediment of crystal formation by insertion of an insulating material near a metal electrode, or insulating layer formation on a metal electrode.

For example, as refer to nonpatent document 1, a test method of protein crystal growth by the conventional external electric field applying method is described.

Also, as refer to nonpatent document 2, for example, a crystallizing device of protein by the conventional external electric field applying method is reported.

In technology of the nonpatent document 1 and the nonpatent document 2, a high voltage of a direct current from several hundreds V to several tens of kV is applied to inter-electrode of the metal electrodes covered with an insulating material, respectively. Thereby, it performs to crystallize a biopolymer easier.

Furthermore, in the patent documents 2, as a kind of the conventional external electric field applying method, a apparatus which applies and crystallize by applying alternating voltage to protein crystallization solution in a micro fluid device is disclosed.

The technology of the patent documents 2 is the method of performing crystal formation according to dielectrophoresis force by an electric field acted in protein and carrying the crystal. Also in this technology, high alternating voltage needed to be applied to inter-electrode on account of configuration of electrodes in the micro fluid.

PRIOR ART DOCUMENT

Patent Documents

[Patent documents 1] JP-A-2003-306497
[Patent documents 2] JP-A-2007-061672

Nonpatent Document

[Nonpatent Document 1]
M. Taleb, C. Didierjean, C. Jelsch, J. P. Mangeot and A. Aubry, and "Equilibrium kinetics of lysozyme crystallization under an external electric field", Journal of Crystal Growth, vol. 232, pp. 250-255 (2001).
[Nonpatent Document 2]
Muhammad Imran aluminum-Haq and Eric Lebrasseur, Wan-Kyu Choi, Hidenori Tsuchiya, Toru Torii, Hiroki Yamazaki and Etsuo Shinohara, and "An apparatus for electric-field-induced protein crystallization", Journal of Applied Crystallography, vol. 40, pp. 199-201 (2007).

SUMMARY OF THE INVENTION

Problem(s) to be Solved by the Invention

However, crystallization solution of the biopolymer has electric conductivity because of including electrolysis ion. Therefore, in the external electric field applying method, there is a problem that the electric field generated in crystallization solution could weaken with the insulating material of an electrode.

Therefore, in the external electric field applying method, in order to obtain an electric field required in order to perform efficient crystallization, the high voltage from several hundreds V to several tens kV usually needed to be applied to inter-electrode. Thus, as for the configuration of a crystallization solution cell, sufficient consideration for the electric insulation of solution cell materials to be used, the measures at the time of an electric short circuit, etc., were required. These became a cause to prevent to reduce miniaturization of a crystallization solution cell by application of the high voltage. In case that a metal electrode was used for a crystallization solution cell, since optical transmittance of metal was extremely low, there was a problem that it was difficult to observe crystal growth optically through a metal electrode. Thus, in order to observe the condition of crystal growth, configuration of the electrode in a crystallization solution cell is needed to be considered. Furthermore, in case of having an optical window for observation to a crystallization solution cell, inter electrode distance is required as large enough.

Therefore, in case that a metal electrode is used, there is a problem that it becomes difficult to fulfill voltage lowering of applied voltage and a down-sizing of a crystallization solution cell simultaneously.

The present invention is achieved in view of such a situation, and makes it a subject to cancel an above-mentioned subject.

Means for Solving the Problem

To achieve the above objects, the present invention provided the following measure. Namely:

A crystallizing device for crystallizing protein or another biopolymer of the present invention is crystallization solution and a conductive material electrode applied to the crystallization solution; the conductive material electrode is a transparent conductor; and the transparent conductor contacts the crystallization solution directly.

The crystallizing device of the present invention is: the transparent conductor electrode is the transparent conductor thin film formed on a transparent substrate, and a crystal of the biopolymer is observable optically by passing the transparent conductor thin film and the transparent substrate.

The crystallizing device of the present invention is further comprising an electric insulating member; and the transparent conductor electrode is formed in plate-like shape; the transparent conductor electrodes formed in the plate-like shape is inscribed and maintained by the electric insulating member; and an almost uniform electric field is applied to the crystallization solution by the transparent conductor electrode formed in the plate-like shape.

The crystallizing device of the present invention is further comprising a voltage generator for applying voltage to the transparent conductor electrode; the voltage applied to the transparent conductor electrode is direct current low voltage and/or the alternating current low voltage.

The crystallizing device of the present invention is the voltage is applied to control an orientation of the biopolymer.

The crystallizing device of the present invention is the crystallization solution is prepared as metastable state based on a batch method, a steamy diffusion method, or a dialysis method.

The crystallizing device of the present invention is the transparent conductor thin film is formed by using an inorganic oxide and/or a transparent conductor of a conductive polymer.

A crystallization solution cell for a biopolymer of the present invention is a transparent conductor electrode for performing internal electric field application of crystallization solution, and crystallization solution is maintained between the transparent conductor electrodes.

An orientation control method for crystallizing a biopolymer of the present invention is performing electrical insulation for transparent conductor electrode by an electric insulating member; maintaining solution contained a biopolymer in contact with the transparent conductor electrode; applying voltage to the transparent conductor electrode; and controlling orientation of the biopolymer by application of the voltage.

The orientation control method of the present invention is a transparent conductor thin film formed on a transparent substrate is used for the transparent conductor electrode.

The orientation control method of the present invention is the voltage applied to the electrode is direct current low voltage and/or alternating current low voltage.

The orientation control method of the present invention is the solution is prepared based on a batch method, a steamy diffusion method, or a dialysis method.

A crystallization method for a biopolymer of the present invention is performing electrical insulation for a transparent conductor electrode by an electric insulating member; maintaining solution contained a biopolymer in contact with the transparent conductor electrode; and applying voltage to the transparent conductor electrode.

The crystallization method of the present invention is a transparent conductor thin film formed on a transparent substrate is used for the transparent conductor electrode.

The crystallization method of the present invention is the voltage applied to the electrode is direct current low voltage and/or the alternating current low voltage.

The crystallization method of the present invention is the solution is prepared based on either a batch method, a steamy diffusion method, or dialysis method.

A crystal of a biopolymer produced by the crystallization method of a biopolymer of the present invention.

Effect of the Invention

According to the present invention, a small crystallizing device of a biopolymer can be provided. The device is: because an electrode is directly contacted in crystallization solution and under-voltage is applied, it is not necessary to give special care to electrical insulation; by a transparent conductor thin film, a temperature rise of crystallization solution by Joule's heat can be suppressed greatly; and crystal growth is optically observable.

MODE OF CARRYING OUT THE INVENTION

Embodiment

The Configuration of the Biopolymer Crystallizing Device 100

Figure 1:
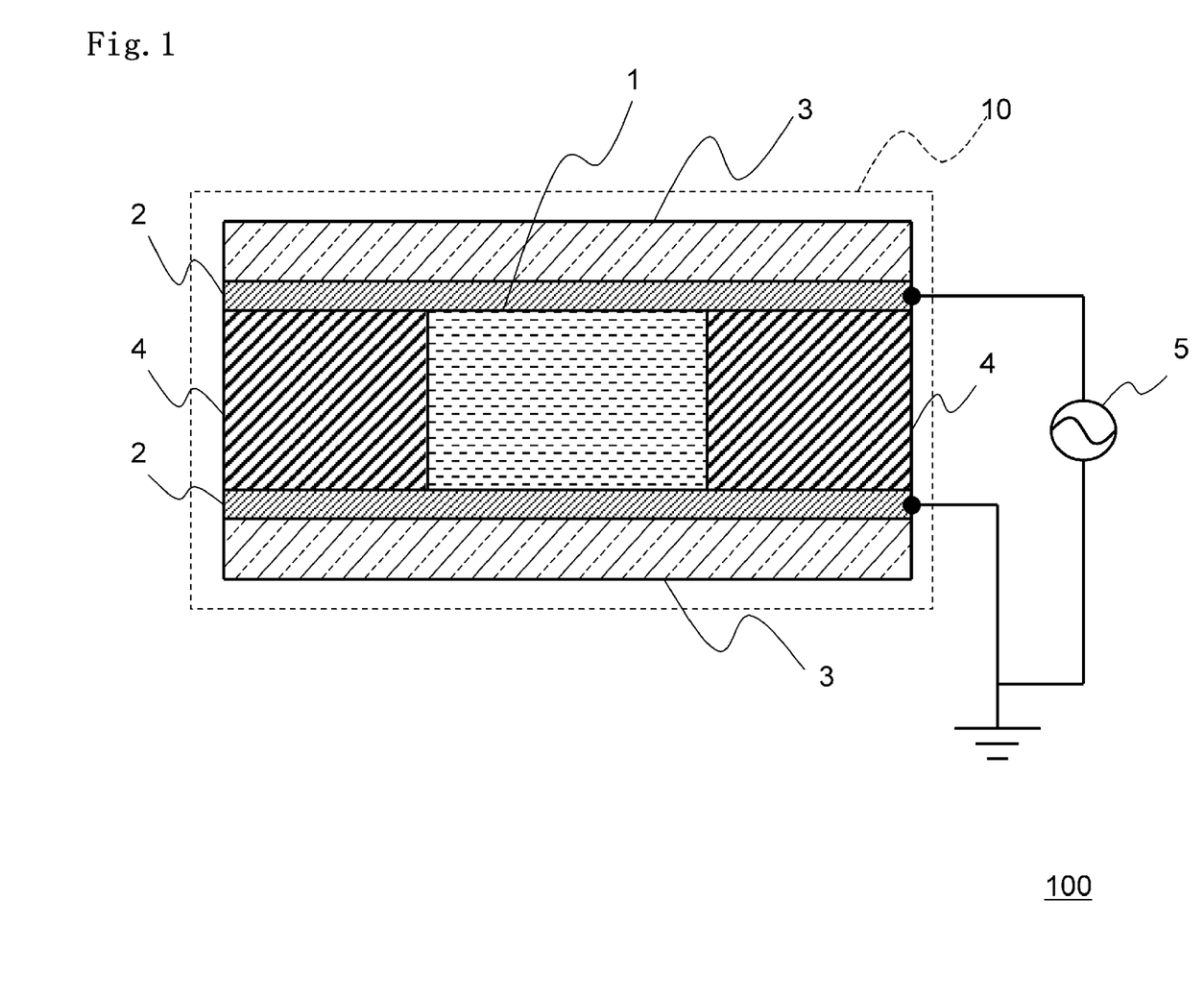
FIG. 1 is a outline sectional view showing the configuration of the crystallizing device related to an embodiment of the invention.

As refer to FIG. 1, the configuration of the biopolymer crystallizing device 100 related to an embodiment of the invention is explained.

The biopolymer crystallizing device 100 is composed of the crystallization solution cell 10 and the voltage generator 5. For these, crystallization solution cell 10 is consisting of the transparent conductor electrode 2, the transparent substrate 3, and the electric insulating member 4.

The crystallization solution cell 10 is a container including the electrode for preparing the crystal of a biopolymer specifically. The crystallization solution cell 10 related to the embodiment of the invention is applicable to the crystallization of various biopolymers which performs crystal formation from solution. Crystallization is achieved by applying the crystallization solution 1 of a biopolymer into this crystallization solution cell 10.

The voltage generator 5 is a voltage generator, which supplies the voltage applied to the crystallization solution of a biopolymer, which is, for example, a function generator to provide sine voltage, etc.

(Configuration of the Crystallization Solution Cell 10)

The crystallization solution cell 10 related to an embodiment of the invention, preferably, for the transparent substrate 3, which are two plate shaped electrode boards in which the transparent conductor electrode 2 of the transparent conductor thin film is formed, the electric insulating member 4, which is a plate-like (surface shape) insulating spacer by predetermined thickness as an electric insulating member, is inserted. Then, the crystallization solution 1 is poured in and maintained in the center of electric insulating member 4. The crystallization solution cell 10 can be prepared in the so-called "sandwiched type" electrode structure in this way.

By using a plate-like electrode for the transparent substrate 3, an almost uniform electric field is generated into crystallization solution. The effect that an electric field can thereby be efficiently applied to the whole biopolymer in solution is acquired. Consequently, the effect is acquired the no very small crystal deposits around the transparent conductor electrode 2 with no prevention to producing a large crystal.

By using a plate-like electrode for the transparent substrate 3, the effect is acquired that the electric field and potential distribution in solution can be expected and analyze the effect of the electric field application in crystallization easily.

The transparent conductor electrode 2 is a thin film of the transparent conductor formed on the transparent substrate 3. The transparent conductor electrode 2 is electrically connected to the voltage generator 5, and the voltage of a predetermined direct current or alternating current supplied from the voltage generator is applied to the crystallization solution. Hence, the transparent conductor electrode 2 functions as an electrode of voltage applied to the crystallization solution of the biopolymer.

Also, the transparent conductor electrode 2 contacts the electrode of a thin film in crystallization solution directly, and it is made to form an electric field efficiently into solution with applied voltage. Therefore, the transparent conductor thin film used as the transparent conductor electrode 2 needs not to become the hindrance of crystal formation, and to be chemically stable to the crystallization solution containing an electrolyte.

The transparent conductor electrode 2, as a transparent conductor, for example, tin containing indium oxide ($In_2O_3$: Sn, ITO), a zinc oxide (ZnO), tin oxide ($SnO_2$), titanium oxide ($TiO_2$), etc., which are inorganic oxides, can be used. For example, it is preferred to use the thin film of the indium oxide (ITO), which is added tin.

In addition, transparent conductive polymers, such as a poly thiophene series and a polypyrrole series, can also be used as a transparent conductor.

Also, the transparent conductor electrode 2 is just required to have the transmissivity which is a level in which optical observation of crystal formation is enabled, and it is not necessary to transparent a predetermined wavelength.

The transparent substrate 3 is a plate-like transparent substrate in which the thin film of the transparent conductor electrode 2 is formed. For the transparent substrate 3, a glass substrate, which is excellent in the light transmittance state and is formed the transparent conductor thin film can be used.

Therefore, by using optical microscopes such as a stereoscopic microscope, magnifiers, etc., optical observation of the condition for crystal formation can be performed.

As the transparent substrate 3, heat-resistant resin (polymers, plastic,) etc., other than a glass substrate, may be used. The transparent substrate 3 can also form or affix a filter, coating, etc., which do not permeate a predetermined wavelength. A polarizing plate, etc., can also be formed, and, thereby, the effect of becoming easy to observe a crystal is acquired by phase contrast, etc.

The electric insulating member 4 is an electrical insulation spacer (hereafter, it is only called an insulating spacer) for insulating the voltage applied to the transparent conductor electrode of the transparent conductor electrode 2. The insulating spacer of the electric insulating member 4 works as an electrical insulation object in case of being applied by a transparent conductor electrode, and it also act as seal material to hold the crystallization solution. A slotted hole, etc., are formed in this insulating spacer, and the space enclosed with a transparent conductor substrate and an insulating spacer functions as a container, which keep the crystallization solution.

As the electric insulating member 4, the insulating spacer of silicon rubber can be used, for example, silicon rubber has excellent electric non-conductance property, it can be formed slotted hole the easily, and the adhesion of a glass substrate, etc., is also excellent. Therefore, it is suitable as an insulating spacer of the electric insulating member 4.

If the span of crystal growth is short period of time comparatively, for example, about several weeks, the insulating spacer made of silicon rubber can prevent the evaporation from crystallization solution, which is the level not serving as a problem to crystal growth.

A Method for Manufacturing of the Crystallization Solution Cell 10

As mentioned above, the biopolymer crystallizing device 100 related to the embodiment of the invention produces the crystal of a biopolymer by the internal electric field applying method as the electric field applying method.

In the following, the structure of each part of the crystallization solution cell 10 for producing the crystal of this biopolymer is explained in detail, and the method for manufacturing of the crystallization solution cell 10 is described.
(Configuration of the Transparent Conductor Electrode 2)

In the crystallization solution cell 10 related to an embodiment of the invention, as the electrode for applying an electric field to crystallization solution, the transparent conductor electrode 2, which does not hinder formation or crystal growth of a crystalline nucleus, is used.

By applying low voltage with the transparent conductor electrode 2, crystal formation of a biopolymer can be performed conveniently and efficiently. In addition, the situation of crystal growth is optically observable through an electrode from the outside.

The transparent conductor electrode 2 related to the embodiment of the invention is material with the sufficient conductivity for using for electric field application and with an excellent light transmittance state. Also, as including electrode, the material of a crystallization solution cell does not hinder crystal formation of a biopolymer.

Here, the configuration of the transparent conductor electrode 2 is explained in detail.

Formerly, bulk (common) metal, for example, copper, silver, gold, platinum, etc., have been used frequently as electrode material. However, these ordinary metallic materials often affected in crystal formation of a biopolymer as mentioned above, and it was not suitable in many cases as an electrode used for the internal electric field applying method.

Because the ordinary metallic material interrupted the transparency of visible light, there was a problem of being difficult for observing crystal formation optically through the metal electrode.

Therefore, as the material of the electrode used for the crystallization solution cell 10 related to the embodiment of the invention, the ordinary metallic material which does not transparent visible light is not preferred.

Here, formerly, the metallic thin film, which metal is thinned and become extremely thin to the level having transparency of light, exist: for example, a vacuum evaporation film or a sputter film, such as silver, gold, and copper, etc., with 30 nm-40 nm thick.

In the crystallization solution cell 10 related to the embodiment of the invention, it can be used such an extremely thin metallic thin film, etc.

However, such the extremely thin metallic thin film peels easily from a substrate, and the mechanical strength is significantly weaker as compared with the bulk metal. Therefore, in order to use such a metallic thin film as an electrode such as the transparent conductor electrode 2 in the crystallization solution cell 10, it is necessary to form a protective film on the metallic thin film.

However, since many types of protective films are dielectric substance, they work as an electrical insulation object. Therefore, the applied electric field will be weakened by this protective film.

Consequently, a transparent conductor that has high conductivity and good light transmittance state is suitable as the transparent conductor electrode 2 of the crystallization solution cell 10 used for the crystallization method of the biopolymer related to the embodiment of the invention.

As this preferable transparent conductor, indium oxide ($In_2O_3$:Sn, ITO) of the tin content which is an inorganic oxide, a zinc oxide (ZnO), tin oxide ($SnO_2$), titanium oxide ($TiO_2$), etc. are listed, for example. Transparent conductive polymers, such as a poly thiophene series and a polypyrrole series, can also be used.

Unlike the conventional metal electrode, such transparent conductor of the inorganic oxide of the conductive polymer is provided with the effect that there is little hindrance of crystalline-nucleus formation or crystal growth of a biopolymer. Therefore, it is especially preferable as the transparent conductor electrode 2 related to the embodiment of the invention.

These transparent conductors can also be used as an electrode in the state such as the thick metal plate of a simple substance. However, many transparent conductors are manufacturability as a thin film. Therefore, in this embodiment, the thin film of the transparent conductor formed on the substrate is used as the transparent conductor electrode 2, which is an electrode of voltage application.

The thin film of a transparent electric conduction thin object of an inorganic oxide is made by dry processes, such as a vacuum evaporation method by resistance heating or electron beam irradiation, and a spattering process, and wet processes, such as a sol gel process, etc. The thin film of a conductive polymer is manufactured by a spin coat method, a spray method, etc., which are made from solution dissolved polymers in a solvent.

Particularly, an ITO film produced by spattering process has high conductivity and light transmittance state, membranous denseness is good, and its shape of a surface type is smooth. That means showing good transparent conductivity. Therefore, especially the ITO film made by the spattering process is preferred as a transparent conductor thin film used for the transparent conductor electrode 2 related to the embodiment of the invention.

For example, as the transparent conductor electrode 2, a good ITO film showing such as, about several 100 nm for film thickness, about 30 nm or less for surface roughness, about several 10 ohm/cm^2 or less for surface resistance, and about 80% or more for the transparency of the visible light range, can be used.

In case that the form of an electrode surface is coarse, the surface may trigger a nucleus of crystal growth. Therefore, as for the surface of the electrode, it is preferred that surface roughness is small as much as possible.

(Configuration of the Transparent Substrate 3)

In the crystallization solution cell 10 related to an embodiment of the invention, as mentioned above, on the transparent substrate 3, the transparent conductor electrode 2, which is a transparent conductor thin film as being an electrode, is formed.

This transparent substrate 3 may just be a material that has good adhesion capacity with the transparent conductor thin film and satisfactory light transmittance state. Especially, various kinds of clear glass, transparent plastics, etc., are suitable as the transparent substrate 3 for formation of a transparent conductor thin film. Because this transparent substrate 3 is transparent, the effect that the situation of crystal growth is optically observable is acquired.

In case that the transparent substrate 3 is formed by using a glass substrate, borosilicate glass such as BK7 and Pyrex (registered trademark), which transparency is good in visible light range, superior in homogeneity, and chemically stable, and silica glass, which have permeability also in an ultraviolet region, etc., are particularly preferable.

In case that the transparent substrate 3 is formed by using a plastic plate as a plastic plate having state superior in a light transmittance and also chemically stable, polyester resin, such as polyethylene terephthalate (PET), polyimide resin, etc., can be used preferably. Unlike a hard glass substrate, such a plastic plate can be used as a flexible substrate bent easily.

The shape of the transparent substrate 3 does not have restriction in particular, and a substrate of various types of shape, such as a plate, a pillar, a cylinder, and a ball, can be used.

A plate-like substrate is particularly preferable because it is the easiest to use and can configure by comparatively easy structure for the crystallization solution cell 10 related to an embodiment of the invention.

(Configuration of the Electric Insulating Member 4)

In case that a crystallization solution cell is sandwiched type electrode structure, volume of an electric field generated into solution is dependent on volume of voltage to apply, and thickness of the electric insulating member 4, which is the insulating spacer inserted between the transparent conductor electrodes 2s.

If it is a range where the electric insulation of an insulating spacer does not degrade, no restriction is for thickness of the electric insulating member 4, and a configuration in order that thickness of an insulating spacer may be thinner as much as possible is preferred.

When a thinner insulating spacer is used, a higher electric field is applied to the crystallization solution 1 in case of adding lower voltage, and it enables to promote crystallization of a biopolymer. Also, an effect is acquired that quantity of crystallization solution to be used can be smaller.

The electric insulating member 4 provides the function that electrically insulates the voltage applied to inter-electrode and maintains the crystallization solution.

As a material of this electric insulating member 4, it is preferred for superior in electric insulation and stable in chemical. As especially preferable material for electric insulating member 4 are listed as glass, polystyrene, polypropylene, acrylics, fluororubber, silicon rubber, etc.

In particular, among them, silicon rubber is preferred as a material for the electric insulating member 4. This is superior in heat resistance, cold resistance, and chemical resistance, is easy for processing, and is easy to use because it adheres easily with a substrate.

(Crystallization Method by the Crystallization Solution Cell 10)

In case of sandwiched type structure for the crystallization solution cell 10, when an insulating spacer of silicon rubber is used for the electric insulating member 4, a sheet of a film of silicon rubber are used is preferred in particular. In this case, a sheet or a film of silicon rubber is also comparatively excellent for adhesion capacity with a glass substrate, etc., and it can be a stuff constituting the crystallization solution cell 10 easily.

Hence, to inside of a sheet or a film of silicon rubber, which is the electric insulating member 4, for example, a slotted hole of arbitrary shape, such as a round shape, elliptical, a rectangle, is formed, and space of the slotted hole formed by inserting this insulating spacer by two transparent substrates 3 can be used as a container of the crystallization solution cell 10. Thereby, the electric insulating member 4 and the transparent substrate 3 function as a container holding the crystallization solution 1.

As mentioned above, the crystallization solution 1 is poured and maintained into the container as the space of the slotted hole in the crystallization solution cell 10.

For example, in case to crystallize with a batch method which mixes a biopolymer solution and precipitant solution and seals in a mixed solution in a solution cell, a slotted hole is formed in the insulating spacer, and it contacts and closes by two electrode substrates.

In the case of crystal production according to a steamy diffusion method for example, required solutions are placed separately within a solution cell, and it is sealed as similar to the batch method.

There is no restriction in particular in the volume of the crystallization solution 1 which can be poured in and maintained at the crystallization solution cell 10. However, because a high-purity biopolymer is expensive and precious, it is desirable that amount of solution used is little as much as possible.

The maximum volume of the crystallization solution, which can be accepted in a crystallization solution cell, is determined by the area of the slotted hole formed in the insulating spacer and the thickness of the insulating spacer. For example, in space of a solution cell for a cylindrical shape, which thickness of the insulating spacer is 1 mm and area of the slotted hole is 10 mm$^2$, the crystallization solution as maximum as 10 micro-L can be maintained.

In addition, an inlet may be provided in the crystallization solution cell 10, and it may pours and uses each solution used by crystallization from this inlet.

In this case, to prevent crystallization solution contacting and oxidizing with air and to stop evaporation from crystallization solution, for example, the seal of the crystallization solution is performed in paraffin oil, etc.

Further, in order not to leak the solution from a crystallization solution cell, the crystallization solution can also be sealed by stacking the insulating spacer and the electrode substrates tightly.

Furthermore, preferably, in order to prevent solution leakage, it is also enabled to perform a seal, for example with grease, etc.

Silicone grease, etc., can be used as grease for leakage prevention.

In addition, it is also enabled to connect the crystallization solution cell 10 related to an embodiment of the invention with a micro passage (device).

In this case, it can also be used that a biopolymer solution to crystallize and its precipitant solution for crystallization are poured in to the crystallization solution cell 10 for electric field application.

It is also provide used an inlet of solution in the crystallization solution cell 10 in this case.

Further, it may be constituted that the crystallization solution 1 is prepared inside the crystallization solution cell 10 for electric field application by adding a buffer (buffer solution,) etc.

A Crystallization Method of the Biopolymer Related to the Embodiment of the Invention (Configuration of the Crystallization Solution 1)

Here, how to crystallize a biopolymer by using the biopolymer crystallizing device 100 related to an embodiment of the invention is explained in more detail.

Figure 2:
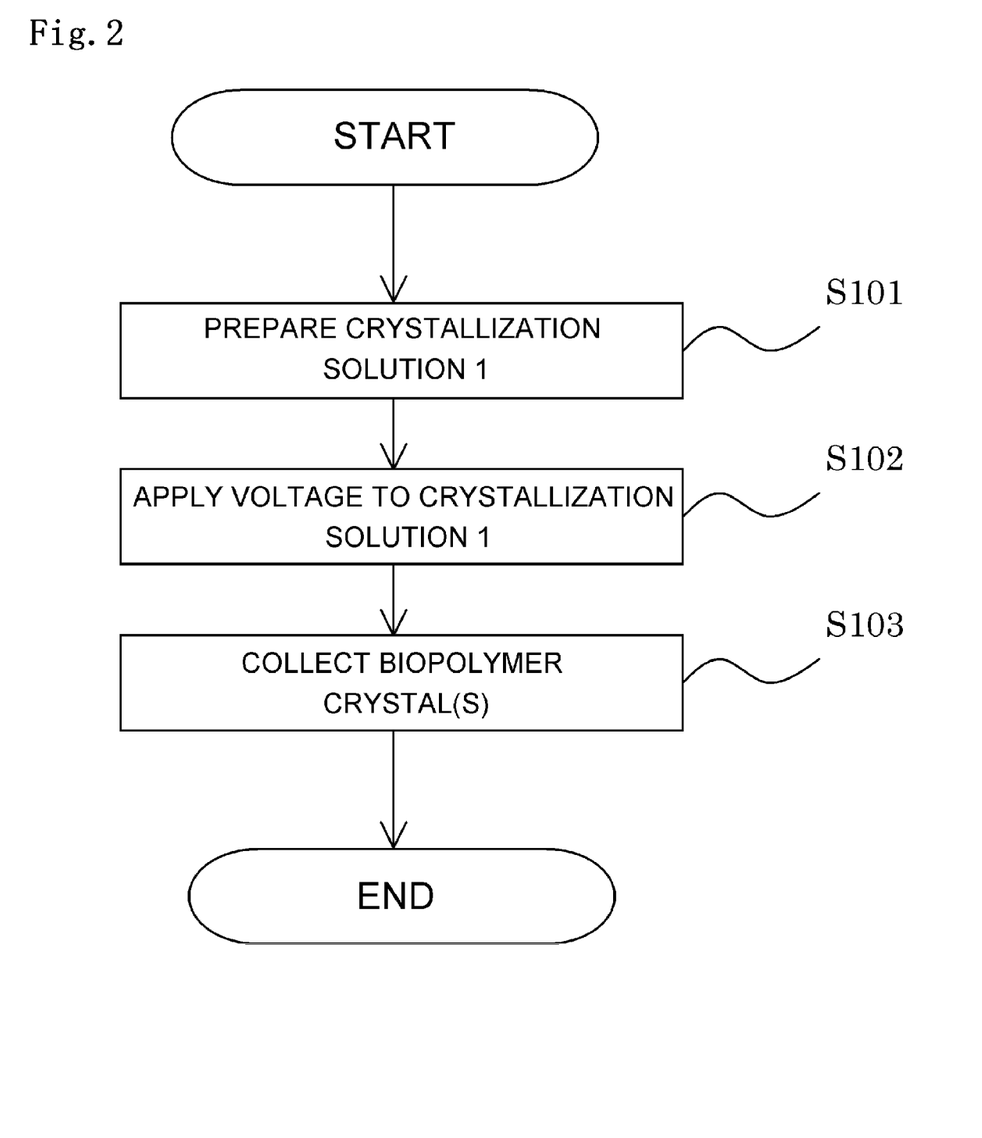
FIG. 2 It is a flow chart of the crystallization method of the biopolymer related to an embodiment of the invention.

In the following, as refer to a flow chart of FIG. 2, it is explained a detailed method to crystallize the biopolymer by using this crystallization solution 1.

(Step S101)

Firstly, definite preparation of the crystallization solution 1 of a biopolymer is performed.

The crystal of a biopolymer such as protein is deposited from a supersaturated solution and is produced. Hence, in general, crystallization is performed by adding precipitants, such as salts, an organic solvent, and a water-soluble polymer, to solution containing a biopolymer and by making solution into a super saturation state.

For crystallization solution 1 of a biopolymer related to an embodiment of the invention, a biopolymer that is a target of crystal formation, solution containing a precipitant for crystallizing the biopolymer, or combination of each solution containing them can be used. In its case, in order to control a pH value, a suitable buffer solution (buffer) for crystallization can be used for these solutions. The crystallization solution 1 is prepared for every biopolymer to produce a crystal.

As the biopolymer, protein can be used, for example. For instance, in an example as mentioned later, the solution containing a chicken egg-white lysozyme and sodium chloride, which is its precipitant, is used.

In addition, it is not limited to a biopolymer represented by protein, peptide, etc., it can be targeted for a polar low molecular substance or an organic macromolecular substance.

Here, in the typical method to generate a crystal from solution containing biopolymers, such as protein, there are a steamy diffusion method, a batch method, dialysis, etc.

In all of these crystallization methods, a biopolymer is crystallized suitably by mixing solution containing a biopolymer rectified by high-purity and solution containing the crystallization precipitant.

For example, in a steamy diffusion method, which is most often used for the crystallization method of protein, solution containing a protein and a precipitant, and solution containing only a precipitant are combined, put in and seals in the separated state in the same container of solution, and crystallized under conditions of a vapor equilibrium by the space.

Crystal production of a biopolymer such as protein is performed by making crystallization solution into a supersaturating state by using a precipitant.

However, by increasing concentration of a precipitant and a biopolymer too much more than needed, etc., crystallization solution will be in a supersaturating state excessively. Then, in many cases, plenty of crystallites are generated at once, and it becomes difficult to obtain a good large-sized crystal, which is suitable for crystallography.

Therefore, it is preferred to generate very small number of crystalline nucleus and to grow up a crystal in crystallization solution as slowly as possible.

Here, for producing good and large-sized biopolymer crystal, it is preferable to produce a crystal in crystallization solution in a metastable state.

According to this embodiment, it is called a metastable state, which is a state of solution which crystal formation does not occur easily even if crystallization solution settles without changing concentration of crystallization solution, etc., or stimulating a certain type, such as light, vibration, pressure, a magnetic field, an electric field, etc.

Also in a crystallization method of a biopolymer by electric field application related to the embodiment of the invention, preferably, the crystallization solution 1 in such a metastable state is used.

(Step S102)

Then, the voltage to the crystallization solution 1 is applied.

Here, many types of a biopolymer, such as protein, have a polar side chain, is held together by hydrogen-bonding among these side chains, and is maintain conformational structure (higher-order structure).

For example, protein has a polar electric charge by the amino group or a carboxyl group in solution. Therefore, protein is partially electrically-charged by amino acid side chains, such as glutamic acid, aspartic acid, and lysine.

Three-dimensional structure of a biopolymer is greatly dependent on a hydrogen bond between such polar side chains. Also, the class (positive/negative) and the charge quantity of the net electric charge that appears on the surface of a biopolymer are dependent on a class and configuration of a polar side chain of a biopolymer, its three-dimensional structure, and a pH value of the solution, etc.

Isoelectric point pH (or only isoelectric point) is well used as an indicator of the total electric charge of protein, and it is a pH value that the amount of surface charge of the whole protein is set to 0 in solution.

A protein that isoelectric point is seven or less is called acidic protein. Contrary, it is called basic protein more than seven.

The total electric charge of protein becomes minus in solution of pH higher than an isoelectric point. Conversely, it becomes positive by lower pH.

Thus, a biopolymer such as protein has the net electric charge depended on the pH value of solution in the solution.

Therefore, in case that an electric field is applied to a biopolymer overall electrified in solution, it is received electrostatic force from the electric field, and it becomes the driving force for the biopolymer to move in addition to thermal energy.

The electrified biopolymer receives electrostatic force from an electric field. Simultaneously, an electrified biopolymer receives resistance which increases with speed from a circumference medium. Consequently, the electrified biopolymer moves at predetermined rate of the equilibrium of both force.

Crystallization of a biopolymer occurs by orientation mainly originated in an interaction between biopolymers with polarity, and a process of crystal formation is progressed from nucleation of a crystal to growth.

In the solution, the biopolymer is in the state of partially charged by a side chain with polarity. Thus, by applying an electric field from the outside, orientation of the biopolymer is performed, and this orientation can be controlled.

Therefore, it provides an orientation control method, which performs orientation control of the biopolymer electrified in solution by electric field application related to the embodiment of the invention.

Here, from the former, a phenomenon that an electrified biopolymer moves by a static electric field is known as electrophoresis. The electrophoresis is widely used for separation and analysis of the biopolymer.

For example, isoelectric point pH of the chicken egg-white lysozyme is 10.5-11.0. Hence, it is basic protein.

As for the chicken egg-white lysozyme, for example in acetic acid buffer solution of pH 4.6, the protein is positively charged as the total charge quantity. In order to perform the above electrophoresis, a static electric field formed by applying direct current voltage is usually added.

By such a static electric field, the chicken egg-white lysozyme moves in the same direction to an electric field in response to electrophoretic force.

On the other hand, electrophoretic force acted to an electrified biopolymer by application of voltage which changes in time, that is, unsteady electric field, depends on frequency of applied voltage and relaxation time by an interaction with a circumference medium.

For example, in case that sine wave alternating current voltage is applied as an unsteady electric field, the electrophoretic force becomes zero by time averaging. Therefore, in a long distance scale, net electrophoretic force does not act on a biopolymer in spite of voltage application.

However, an unsteady electric field formed by voltage application which change in time gives, even if it is a short time, gives local driving force to an electrified biopolymer, an electrolytic ion included in solution, etc. Consequently, these can be made to shake.

Also, in the internal electric field applying method that electrodes contact crystallization solution directly, application of alternating voltage has an effect which inhibits a chemical reaction in electrodes, such as electrolysis.

Here, an electric field formed in the crystallization solution 1 related to the embodiment of the invention is formed by voltage applied to the transparent conductor electrode 2 from the voltage generator 5.

There is no restriction in particular in a class of this voltage applied, and it sets up according to a property of a biopolymer, the characteristics of crystallization solution to crystallize (concentration, pH value, temperature, etc.), or the like.

Also, as this voltage applied, a direct current and/or alternating voltage can be used, for example.

As a type of alternating voltage, a triangular wave, a square wave, etc., other than a typical sinusoidal wave can be listed and used in the present invention. Also, voltage, such as a single shot pulse wave, can be used other than alternating voltage which changes continuously.

Furthermore, an electric field by adding alternating voltage on direct current voltage may be applied to the crystallization solution 1.

In the conventional direct-current-voltage application, as the configuration parameter in crystallization by electric field application, volume of inter-electrode applied voltage was used.

On the other hand, in the case of applying alternating voltage in a crystallization method related to the embodiment of the invention, it also sets up the effective value and frequency as parameters.

In a crystallization method related to this embodiment, as voltage applied to the crystallization solution 1, a type of most suitable applied voltage is determined by characteristics, such as the conductivity and dielectricity of crystallization solution, crystallization conditions of a biopolymer, characteristics, such as the conductivity, etc., for a transparent conductor used as an electrode, structure of a solution cell, etc.

In this case, as for voltage applied to the crystallization solution 1, it is preferred to be low as possible. In many cases, electrolysis ion is included in the crystallization solution 1 containing buffer solution for pH value adjustment, and the crystallization solution shows conductivity. Therefore, a high electric field by high voltage application above to some extent occurs large conduction current in the crystallization solution 1. Thereby, Joule's heat may occur, and influence may appear for raising temperature of the crystallization solution 1. Therefore, it is preferred to apply low voltage.

In a crystallization method of a biopolymer related to an embodiment of the invention, "direct current low voltage" means that direct current voltage which volume of voltage is equal or not more than about 50V, and that is equal or less than 10V particularly.

In addition, "alternating current low voltage" means that alternating voltage which effective value is equal or not more than about 50V in the similar manner as above-mentioned, and that is equal or less than 10V particularly.

Conduction current in solution promotes a chemical reaction accompanying electron transfer in an electrode surface.

Because a chemical reaction at such an electrode surface may change electrolytic concentration, a pH value, etc., in crystallization solution, it makes change environment for crystal formation of a biopolymer severely. Therefore, a chemical reaction of an electrode surface is not preferred for good crystal production.

Consequently, to form a high electric field above to some extent into crystallization solution is not preferred to crystal growth of a biopolymer.

Because a high electric field also becomes a factor, which changes a lot for, the biopolymers' own structure, an interaction with the surrounding solvent, etc., low voltage application as much as possible is preferred.

Volume and distribution of the electric field in the solution suitable for crystallization is dependent on a type or concentration of a precipitant and a biopolymer, a type or a pH value of buffer solution to be used, and temperature of solution, etc. Therefore, based on these characteristics, applying voltage is determined in consideration of an inter-electrode distance or configuration of an electrode.

For the voltage generator 5 to generate voltage applied to the crystallization solution 1, it can be used that a direct current power supply for low electric power supplies or an alternating current power supply for low electric power supplies which can generate alternating voltage, such as a sinusoidal wave, and a triangular wave.

As for the preferable voltage generator 5 related to the embodiment of the invention, a function generator for low electric power supplies can be used, which can generate alternating voltage of maximum output voltage about 10V and various shape, such as an about sinusoidal wave, a triangular wave, a square wave, with a wide frequency range (several mHz-several tens MHz), and direct current voltage equal or less than about 10V.

As the voltage generator 5, a function generator that generates voltage continuously is used, and it can also be used further to have functions for oscillation, a function being able to have control action of the voltage generating in a gate oscillation, in addition, a sweep, modulation, a program function to generate voltage.

As time to apply to the crystallization solution 1, it applies sufficient time for performing orientation of the biopolymer by the electric field. This time is generally preferred for several hours to several days. It is considered that by applying much short time, the biopolymer cannot be in orientation enough, and on the contrary, by applying too much long time, the quality of a crystal will be affected. Also, as for a type of a biopolymer, for example, in the case of a biopolymer, which is hard to crystallize such as membrane protein, conditions for applying an electric field of a low voltage for a long time or applying a stronger electric field in pulse, etc., can be set up.

Then, after stopping voltage application, a crystal is generable by leaving from several days to several ten days. Here, in case that a crystal is not formed or the quality is not enough, it can be done to return to the above-mentioned step and to re-consider the conditions.

In this case, since the crystallization solution cell 10 of this embodiment can observe a crystal optically, it is preferred.
(Step S103)

Then, biopolymer crystal(s) are collected.

In the crystallization solution cell 10 related to an embodiment of the invention, a crystal of a biopolymer produced (manufactured) can be collected from a solution cell easily.

As the recovery method of a crystal made to produce, methods that decomposing the crystallization solution cell 10 and taking a crystal with the solution, or extracting a crystal in solution from the inlet of solution, or the like, can be used.

Also, by providing an extraction opening for collection in the crystallization solution cell 10, a produced crystal can be collected without decomposing the solution cell.

In order to perform structural analysis by diffractometry of a X-ray or a neutron beam, etc., in some cases, a biopolymer crystal formed by electric field application should be grown further.

In this case, a biopolymer crystal collected from the crystallization solution cell 10 related to the embodiment of the invention can be moved to a solution cell for crystal growth (not illustrated), and the crystal is enlarged by supplying biopolymer materials, etc., in it.

Furthermore, formed crystals of a biopolymer can also not be collected from the crystallization solution cell 10, and crystallization solution cell 10 itself can be attached to measurement section, such as a diffractometry apparatus of an X-ray or a neutron beam. Thus, it also enables to perform structure evaluation of the formation crystal in solution.

Thereby, it can prevent higher-order structure of biopolymers, such as protein, is damaged by drying. Also, more accurate higher-order structure can be analyzed.

The following effects can be acquired with constituting as mentioned above.

Firstly, in a crystallizing device for the conventional electric field applying method, an electrode having metal of bulk was used, and thus there was a problem for disturbing of crystalline-nucleus formation or crystal growth. Therefore, material and a configuration of structure of an electrode were desired without disturbance of crystalline-nucleus formation or crystal growth.

For this object, as the transparent conductor electrode 2 for applying an electric field in the crystallization cell 10, the biopolymer crystallizing device 100 related to an embodiment of the invention uses a transparent conductor electrode, which is not the ordinary metal electrode. Unlike an electrode of bulk metal, plenty of crystallites do not be produced in this transparent conductor electrode 2.

Therefore, the feature of not becoming the disturbance of crystal formation is provided. Hence, even if a biopolymer to crystallize is active to metal in crystal formation, by using the transparent conductor electrode 2, an excellent crystal can be made.

Also, as mentioned above, it can constitute that the crystallization solution cell 10 related to the embodiment of the present invention is formed transparent conductor electrode 2 filmy, and the transparent conductor electrode 2s maintains by being put to the electric insulating member 4.

Thereby, an almost uniform electric field can be applied to the crystallization solution 1. That means, by a uniform and equal electric field, a biopolymer can be suitably orientated. Thus, a good (high-quality) crystal of a biopolymer can be prepared.

Also, in the biopolymer crystallizing device 100 related to the embodiment of the invention, an electrode is directly contacted in crystallization solution, and a low voltage is applied. Therefore, the special feature is provided that it is not necessary to give extra care to electrical insulation.

Also, by application of a low voltage by using the biopolymer crystallizing device 100, even if a little biopolymer solutions is used, orientation control of the biopolymer can be performed.

Formerly, temperature of crystallization solution of a biopolymer was a factor which had serious influence for crystal formation or growth.

As compared with this, in the crystallization solution cell 10 related to an embodiment of the invention, an input of low electric power by a low voltage is performed. Therefore, a temperature rise of crystallization solution by Joule's heat can be suppressed greatly. Also, since it is the low voltage, electrolysis, etc., is hardly occur, degradation by changing pH of the crystallization solution 1, etc., can be suppressed.

Consequently, an excellent crystal of a biopolymer can be obtained as compare with the conventional crystallization method and the crystallizing device of a biopolymer by electric field application.

Further, as compared with the bulk metal electrode having extreme low light transmittance state, the transparent conductor electrode 2 is provided with the special feature that a light transmittance state in visible light range is high enough. Also, in this embodiment, a light transmittance state also constitutes the transparent substrate 3 high.

Therefore, the crystallization solution cell 10 related to the embodiment of the invention can observe a state of crystal growth optically from the outside.

Consequently, optical observation from the outside is not blocked. Namely, crystal growth of a biopolymer is easily observable. Thereby, a crystal of a biopolymer can be grown up on more appropriate conditions. Since it is not necessary to provide an optical window for observation in the crystallization solution cell 10, the size of the crystallization solution cell can be reduced.

Accordingly, even if the crystallization solution 1 is little quantity, a crystal of a biopolymer can be produced (made, formed) efficiently.

The crystallization solution cell 10 can be sealed, can suppress evaporation of water, etc., and can prevent contamination of dust, bacteria, a foreign substance, etc. Therefore, degradation of the crystallization solution 1 can be suppressed, and a crystal of a biopolymer more of high quality than the conventional technology can be obtained.

Also, since a crystal is generable for a short period of time, it is hard to be affected by influence of a difference of composition of the crystallization solution 1, etc., and can crystallize easily.

As mentioned above, the biopolymer crystallizing device 100 related to this embodiment, as an electrode for applying an electric field to solution for crystallization, a transparent conductor which does not become the disturbance of crystal formation is used. A crystallization solution cell of structure is constituted in consideration of configuration of the electrode for performing crystal formation efficiently to a little biopolymer solutions in application of a low voltage. Thus, a state of crystal formation is optically observable from the electrode side.

By the biopolymer crystallizing device 100, a method of producing a crystal efficiently with a little crystallization solution and its manufacturing device (crystallizing device) can be provided.

A crystal of a produced biopolymer is enabled to analyze a crystal structure by NMR measurement, X diffraction measurement, and neutron diffraction measurement, further. In particular, from structural analysis according to neutron diffraction measurement, detailed information about configuration of hydrogen and a water molecule in respect of a function of a biopolymer and a biochemical reaction can be acquired.

As an experimental study institution for that, it can be utilized Materials and Life Science Experimental Facility (MLF,) in a high-intensity proton accelerator facility (J-PARC) can be used, for example.

In the case of such crystal analysis, the crystallization solution cell 10 which has settled a crystal can load in the analysis device.

Although it is preferred to use protein as a biopolymer related to an embodiment of the invention, it is not restricted to it. For example, an organic compound macromolecules, such as nucleic acid (DNA, RNA, etc.), PNA (Peptide Nucleic Acid), lipoid, sugar, and the like can be used.

Also, as protein, a mixture of sugar protein, and lipoid and protein, etc., can be treated other than ordinary protein, which is combined amino acid only. Further, a peptide, which a protein is digested by predetermined enzyme, etc., a unit, or a complex of protein, etc., can be crystallized as they are. In addition, it also enables to produce a crystal of: metabolic product of living organism, or a drug, which is low-molecule to macromolecule, etc. Furthermore, liquid crystal materials, etc., other than a biopolymer can be crystallized.

Because voltage is uniformly applied even in case of remaining some impurities in protein, a good single crystal can be obtained and selected.

Furthermore, it can also use for search for most suitable crystallization conditions from solution and crystal production to organic materials of a lowmolecule or a macromolecule without restricting crystallization to a biopolymer as a target.

In addition, as the configuration of a crystallization solution cell of other structures, a transparent conductor electrode and a transparent substrate can also be constituted to provide only for one surface. Also, for example, an electrode and a substrate of a surface of another side can also be constituted in a mirror finished-like surface. In this case, a crystal of a biopolymer is observable by reflected light through a transparent surface.

As a configuration of a crystallization solution cell of the other structures, it can also constitute as so-called coplanar type electrode structure. Namely, a transparent conductor thin film is formed at a suitable gap in parallel on the same substrate, for example, crystallization solution is settled on this transparent thin film inter-electrode, and voltage is applied in parallel to the substrate. In this case, it is constituted that a lot of group of electrodes may be placed along with substrate surface, for example, it can be made as configuration of a comb type electrode.

By using this coplanar type electrode structure, it constitutes that the substrates are dielectric materials and have electric insulation. Therefore, the substrate itself functions as an inter-electrode electric insulating member, and it is not necessary to insulate between two electrodes by other electric insulating members in particular. However, even in this case, an electric insulating member is placed between thin film electrodes, and the crystallization solution can be poured in and maintained in the electric insulating member.

Unlike the sandwiched type electrode structure, which electrodes counters to each other and has placed in parallel, electric field distribution of crystallization solution is not uniform in a crystallization solution cell of coplanar type electrode structure. Therefore, in order to boost a facilitator effect of crystal formation, application of higher voltage is needed.

Examples

Then, based on a drawing, the present invention further explains by example(s). However, the following examples do not restrict the present invention.

Figure 3A:
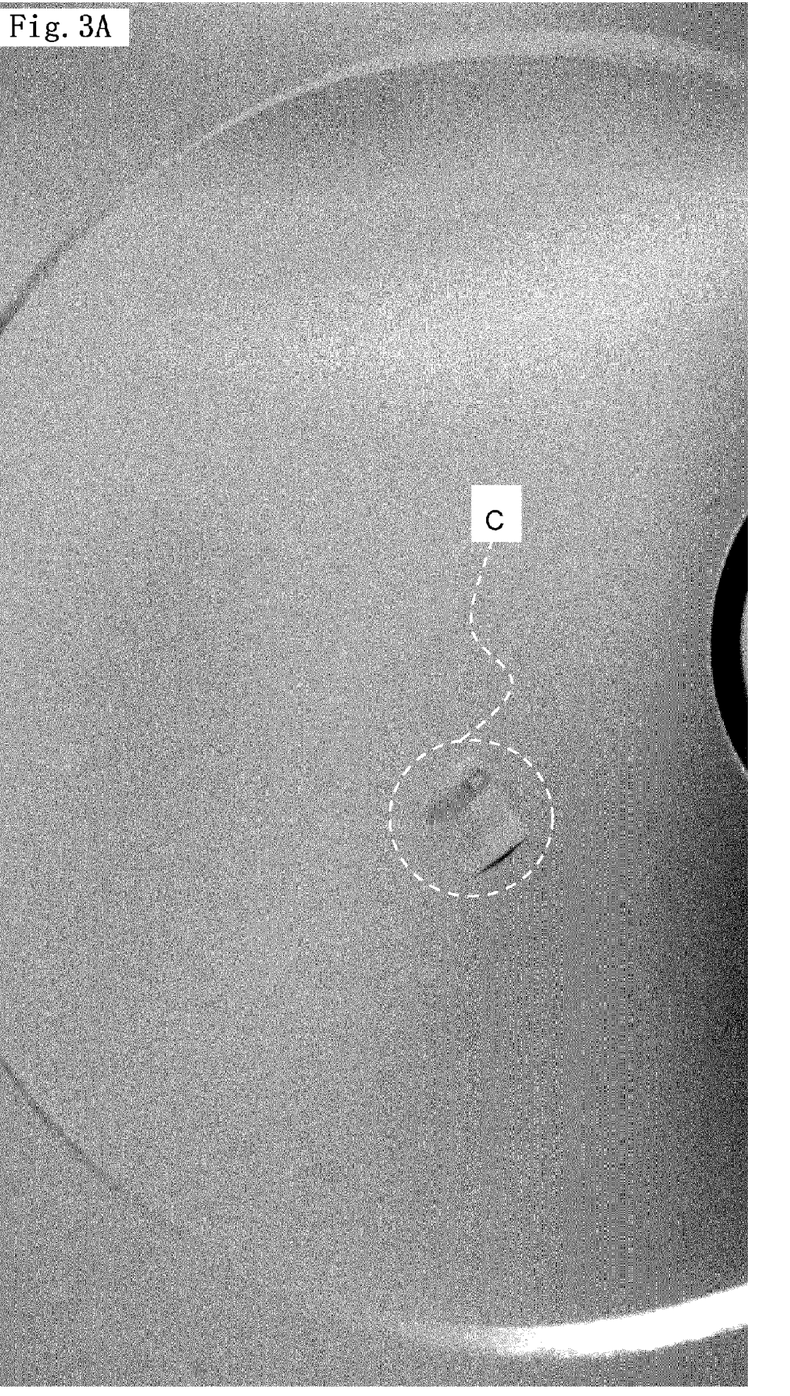
FIG. 3A It is a photograph in which the result of crystallization related to the example of the present invention is shown.
Figure 3B:
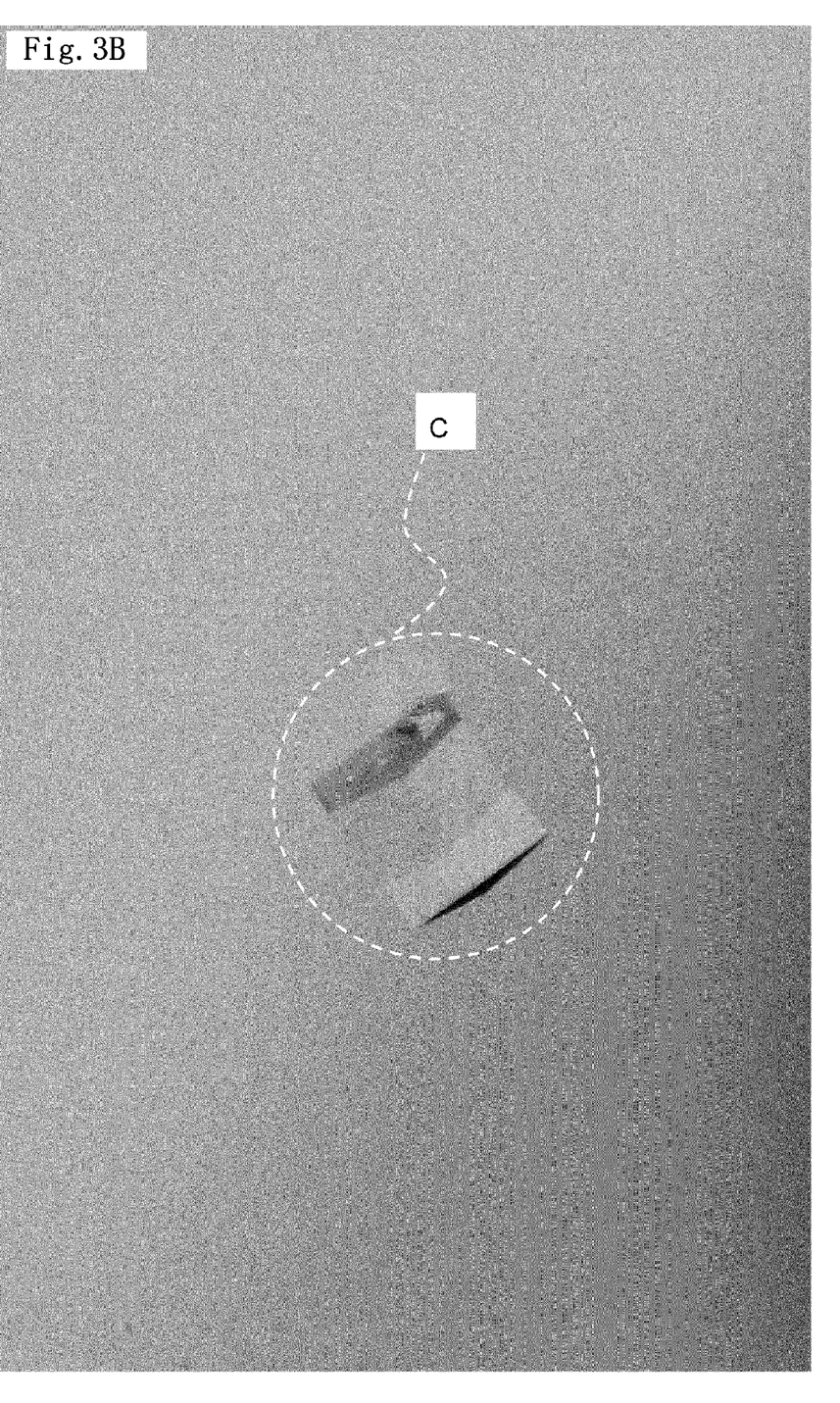
FIG. 3B It is a photograph in which the result of crystallization related to the example of the present invention is shown.

Here, as refer to FIG. 3A and FIG. 3B, an example is shown as a result for producing by using chicken egg-white lysozyme (example 1).

Firstly, in Example 1, as the crystallization solution cell 10, an ITO film about 140 nm thick (surface resistance about 10 ohm/cm^2, more than 83% of transparency), which is transparent conductor electrode 2, is formed on a plate-like glass substrate, which is the transparent substrate 3.

Also, silicon rubber with a thickness of 1 mm which forms a circular slotted hole about 7 mm in diameter is used for the insulating spacer of the electric insulating member 4.

Then, one pair of the transparent substrate 3 has been placed in order that the transparent conductor electrode 2s are faced with separating by the electric insulating member 4. Accordingly, they constitutes as the crystallization solution cell 10.

Here, in Example 1, solution which mixes 30 mg/mL concentration of chicken egg-white lysozyme with 3% concentration of sodium chloride as a precipitant in acetic acid buffer solution of the pH value 4.6 is used as the crystallization solution 1. Therefore, the crystallization solution is prepared based on the so-called batch method in this example. In this case, for the comparison of the crystallization examination by voltage application, another crystallization solution 1 made under the same conditions is used. Crystallization solution 1 of chicken egg-white lysozyme on the above-mentioned conditions is metastable state that crystallization does not occur at 20 degree-C. in temperature if there is no contamination of dust triggering crystalline-nucleus formation, no certain stimulus from the outside influencing to crystallization, etc.

Further, to the slotted hole of the crystallization solution cell 10, about 30 micro-L of the crystallization solution 1, which is the prepared crystallization solution of chicken egg-white lysozyme, is put and sealed.

In addition, the chicken egg-white lysozyme is a typical protein in which various conditions of crystallization are well investigated, and a good-quality crystal with high-purity can be obtained easily. Therefore, it is a biopolymer suitable as an example of the present invention.

Also, salt, such as sodium chloride is used well as the precipitant for making a protein solution into a supersaturating state and crystallizing it.

Also, acetic acid buffer solution and a phosphate buffer solution is used commonly for buffer solution (buffer) which stabilizes a pH value.

Then, from the voltage generator 5 to inter-electrode, which is an ITO film of the transparent conductor electrode 2, alternating voltage is applied in the most suitable predetermined time for the crystallization solution 1 of a chicken egg-white lysozyme.

In Example 1, within the crystallization solution cell 10 enclosed the crystallization solution 1 of chicken egg-white lysozyme, sine wave alternating current voltage of the effective value 0.71V and frequency of 20 Hz made to generate with a function generator of the voltage generator 5 is applied for 9 hours to the transparent conductor electrode 2 of a transparent conductor thin film. Subsequently, voltage application is stopped and leave for two days. During time under application of voltage and observation of subsequent progress, the crystallization solution cell is settled at room temperature of 20 degree-C. The crystallization solution cell 10 constituted from a transparent conductor electrode is settled on the same condition and the same period without applying voltage (comparative example 1).

Then, after stopping voltage application and passing several days, a state of formation for a crystal in the crystallization solution cell 10 is observed.

In the crystallization solution cell 10 of the comparative example 1, which does not apply voltage to a transparent conductor electrode, crystal formation of chicken egg-white lysozyme is not confirmed (not illustrated). Therefore, by this settlement span at room temperature of 20 degree-C. in crystallization solution of a metastable state, it is shown that a crystal of chicken egg-white lysozyme is not formed.

Also, crystal formation is not observed although a transparent conductor contacts crystallization solution directly. Therefore, an ITO transparent conductor thin film does not disturb crystalline-nucleus formation or crystal growth for chicken egg-white lysozyme. Furthermore, it is shown silicon rubber used for the insulating spacer does not hinder crystal formation.

On the other hand, as refer to FIG. 3A and FIG. 3B, the case that voltage is applied to crystallization solution is explained. FIG. 3A and FIG. 3B show the photographs by the optical microscope of Example 1 photo through the transparent conductor electrode 2 in crystallization solution 1.

As shown in FIG. 3A (*12 times) and FIG. 3B (*24 times) which is the enlarged photograph, one piece of the crystal C which is chicken egg-white lysozyme crystal of cubic shape (one-side size is about 0.5 mm) is formed.

In this example, although an electric field applied to crystallization solution is a low value about $7.1*10^2$ V/m, an effect that promotes crystallization to crystallization solution in the metastable state is recognized.

Since the crystallization solution cell 10 is transparent enough, a state of a crystal is observable through light from a light irradiating part of a microscope.

INDUSTRIAL APPLICABILITY

The crystallization method of a biopolymer and a crystallizing device in the present invention can use for searching crystallization conditions of a biopolymer such as protein and producing a high quality biopolymer crystal which is adaptive for crystallography by an X-ray or neutron diffraction measurement.

DESCRIPTION OF NOTATIONS

1 Crystallization Solution
2 Transparent Conductor Electrode
3 Transparent Substrate
4 Electric Insulating Member
5 Voltage Generator
10 Crystallization Solution Cell
100 Biopolymer Crystallizing Device
C crystal

What is claimed is:

1. A crystallizing device for crystallizing protein or another biopolymer, wherein comprising:
   crystallization solution and a conductive material electrode applied to the crystallization solution;
   the conductive material electrode is a transparent conductor;
   the transparent conductor contacts the crystallization solution directly; and
   further comprising an electric insulating member; wherein the transparent conductor electrode is formed in plate-like shape;
   the transparent conductor electrodes formed in the plate-like shape is inscribed and maintained by the electric insulating member; and
   an almost uniform electric field is applied to the crystallization solution by the transparent conductor electrode formed in the plate-like shape.

2. The crystallizing device of the biopolymer according to claim 1, wherein
   the transparent conductor electrode is the transparent conductor thin film formed on a transparent substrate, and
   a crystal of the biopolymer is observable optically by passing the transparent conductor thin film and the transparent substrate.

3. The crystallizing device according to claim 1, wherein
   further comprising a voltage generator for applying voltage to the transparent conductor electrode;
   the voltage applied to the transparent conductor electrode is direct current low voltage and/or the alternating current low voltage.

4. The crystallizing device according to claim 3, wherein the voltage is applied to control an orientation of the biopolymer.

5. The crystallizing device according to claim 1, wherein the crystallization solution is prepared as metastable state based on a batch method, a steamy diffusion method, or a dialysis method.

6. The crystallizing device according to claim 2, wherein the transparent conductor thin film is formed by using an inorganic oxide and/or a transparent conductor of a conductive polymer.

7. A crystallization solution cell for a biopolymer, wherein comprising:
   a transparent conductor electrode for performing internal electric field application of crystallization solution, and crystallization solution is maintained between the transparent conductor electrodes, wherein
   further comprising an electric insulating member,
   the transparent conductor electrode is formed in plate-like shape, the transparent conductor electrodes formed in the plate-like shape is inscribed and maintained by the electric insulating member, and an almost uniform electric field is applied to the crystallization solution by the transparent conductor electrode formed in the plate-like shape.

8. An orientation control method for crystallizing a biopolymer, wherein comprising the steps of:

performing electrical insulation for transparent conductor electrode by an electric insulating member;

maintaining solution contained a biopolymer in contact with the transparent conductor electrode;

forming the transparent conductor electrode as plate-like shape;

inscribing and maintaining the transparent conductor electrodes formed in the plate-like shape by the electric insulating member;

applying an almost uniform electric field to the crystallization solution by the transparent conductor electrode formed in the plate-like shape; and controlling orientation of the biopolymer by application of the voltage.

9. The orientation control method for a biopolymer according to claim 8, wherein a transparent conductor thin film formed on a transparent substrate is used for the transparent conductor electrode.

10. The orientation control method according to claim 8, wherein a voltage applied to the transparent conductor electrode is direct current low voltage and/or alternating current low voltage.

11. The orientation control method according to claim 8, wherein the solution is prepared based on a batch method, a steamy diffusion method, or a dialysis method.

12. A crystallization method for a biopolymer, wherein comprising the steps of:

performing electrical insulation for a transparent conductor electrode by an electric insulating member;

maintaining solution contained a biopolymer in contact with the transparent conductor electrode; and forming the transparent conductor electrode as plate-like shape;

inscribing and maintaining the transparent conductor electrodes formed in the plate-like shape by the electric insulating member;

applying an almost uniform electric field to the crystallization solution by the transparent conductor electrode formed in the plate-like shape;

controlling orientation of the biopolymer by application of the voltage; and applying voltage to the transparent conductor electrode.

13. The crystallization method according to claim 12, wherein a transparent conductor thin film formed on a transparent substrate is used for the transparent conductor electrode.

14. The crystallization method according to claim 12, wherein a voltage applied to the transparent conductor electrode is direct current low voltage and/or the alternating current low voltage.

15. The crystallization method according to claim 12, wherein the solution is prepared based on either a batch method, a steamy diffusion method, or dialysis method.

* * * * *